(12) United States Patent
Yang et al.

(10) Patent No.: US 11,004,740 B2
(45) Date of Patent: May 11, 2021

(54) STRUCTURE AND METHOD FOR INTERCONNECTION WITH SELF-ALIGNMENT

(71) Applicant: Taiwan Semiconductor Manufacturing Co., Ltd., Hsin-Chu (TW)

(72) Inventors: Tai-I Yang, Hsinchu (TW); Yu-Chieh Liao, Taoyuan County (TW); Chia-Tien Wu, Taichung (TW); Hsin-Ping Chen, Hsinchu (TW); Hai-Ching Chen, Hsinchu (TW); Shau-Lin Shue, Hsinchu (TW)

(73) Assignee: TAIWAN SEMICONDCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/560,717

(22) Filed: Sep. 4, 2019

(65) Prior Publication Data

US 2020/0105598 A1   Apr. 2, 2020

Related U.S. Application Data

(60) Provisional application No. 62/737,564, filed on Sep. 27, 2018.

(51) Int. Cl.
*H01L 21/768* (2006.01)
*H01L 21/311* (2006.01)
(Continued)

(52) U.S. Cl.
CPC .. *H01L 21/76897* (2013.01); *H01L 21/31053* (2013.01); *H01L 21/31116* (2013.01);
(Continued)

(58) Field of Classification Search
CPC ......... H01L 21/76897; H01L 21/32139; H01L 21/76885; H01L 21/76807
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — David A Zarneke
(74) *Attorney, Agent, or Firm* — Haynes and Boone, LLP

(57) ABSTRACT

The present disclosure provides a method of forming an integrated circuit structure. The method includes depositing a first metal layer on a semiconductor substrate; forming a hard mask on the first metal layer; patterning the first metal layer to form first metal features using the hard mask as an etch mask; depositing a dielectric layer of a first dielectric material on the first metal features and in gaps among the first metal features; performing a chemical mechanical polishing (CMP) process to both the dielectric layer and the hard mask; removing the hard mask, thereby having portions of the dielectric layer extruded above the metal features; forming an inter-layer dielectric (ILD) layer of the second dielectric material different from the first dielectric material; and patterning the ILD layer to form openings that expose the first metal features and are constrained to be self-aligned with the first metal features by the extruded portions of the first dielectric layer.

20 Claims, 10 Drawing Sheets

(51) Int. Cl.
   *H01L 21/3213*    (2006.01)
   *H01L 23/532*     (2006.01)
   *H01L 23/522*     (2006.01)
   *H01L 21/3105*    (2006.01)

(52) U.S. Cl.
   CPC .. *H01L 21/32139* (2013.01); *H01L 21/76807* (2013.01); *H01L 21/76808* (2013.01); *H01L 21/76885* (2013.01); *H01L 23/5226* (2013.01); *H01L 23/53295* (2013.01); *H01L 23/53257* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,793,159 B2 * | 10/2017 | Wallace ............ H01L 21/76807 |
| 10,032,632 B2 * | 7/2018 | Arnold ................ H01L 21/0337 |
| 10,403,542 B2 * | 9/2019 | Roy .................. H01J 37/32715 |
| 10,510,540 B2 * | 12/2019 | Zhang ................ H01L 21/3086 |
| 10,553,485 B2 * | 2/2020 | Zhang ............... H01L 21/76879 |
| 10,600,688 B2 * | 3/2020 | Zhang ............... H01L 21/76846 |
| 10,714,421 B2 * | 7/2020 | Yang ................ H01L 21/76885 |

\* cited by examiner

STRUCTURE AND METHOD FOR INTERCONNECTION WITH SELF-ALIGNMENT

PRIORITY DATE

This application claims priority to U.S. Provisional Patent Application Ser. No. 62/737,564 filed Sep. 27, 2018, the entire disclosure of which is hereby incorporated herein by reference.

BACKGROUND

Integrated circuits have progressed to advanced technologies with smaller feature sizes. In these advanced technologies, the devices (such as transistors) shrink and therefore induce various issues, such as contact to gate bridging concern. Furthermore, three dimensional transistors with fin active regions are often desired for enhanced device performance. Those three-dimensional field effect transistors (FETs) formed on fin active regions are also referred to as FinFETs. FinFETs are desired to have narrow fin width for short channel control, which leads to smaller S/D regions than those of planar FETs. This will further degrade the contact to S/D landing margin. Along with the scaling down of the device sizes, the contact size was continuously shrunk for high-density gate pitch requirement. To shrink the contact size without impacting contact resistance, there are challenges including material integration, processing and designing constrains. Accordingly, the interconnection misalignment, such as metal lines to vias or vias to contacts, may causes additional issues, such as bridging issues. This is getting even worse on fin transistors because fin active regions are very narrow. Therefore, there is a need for an interconnection structure and method to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
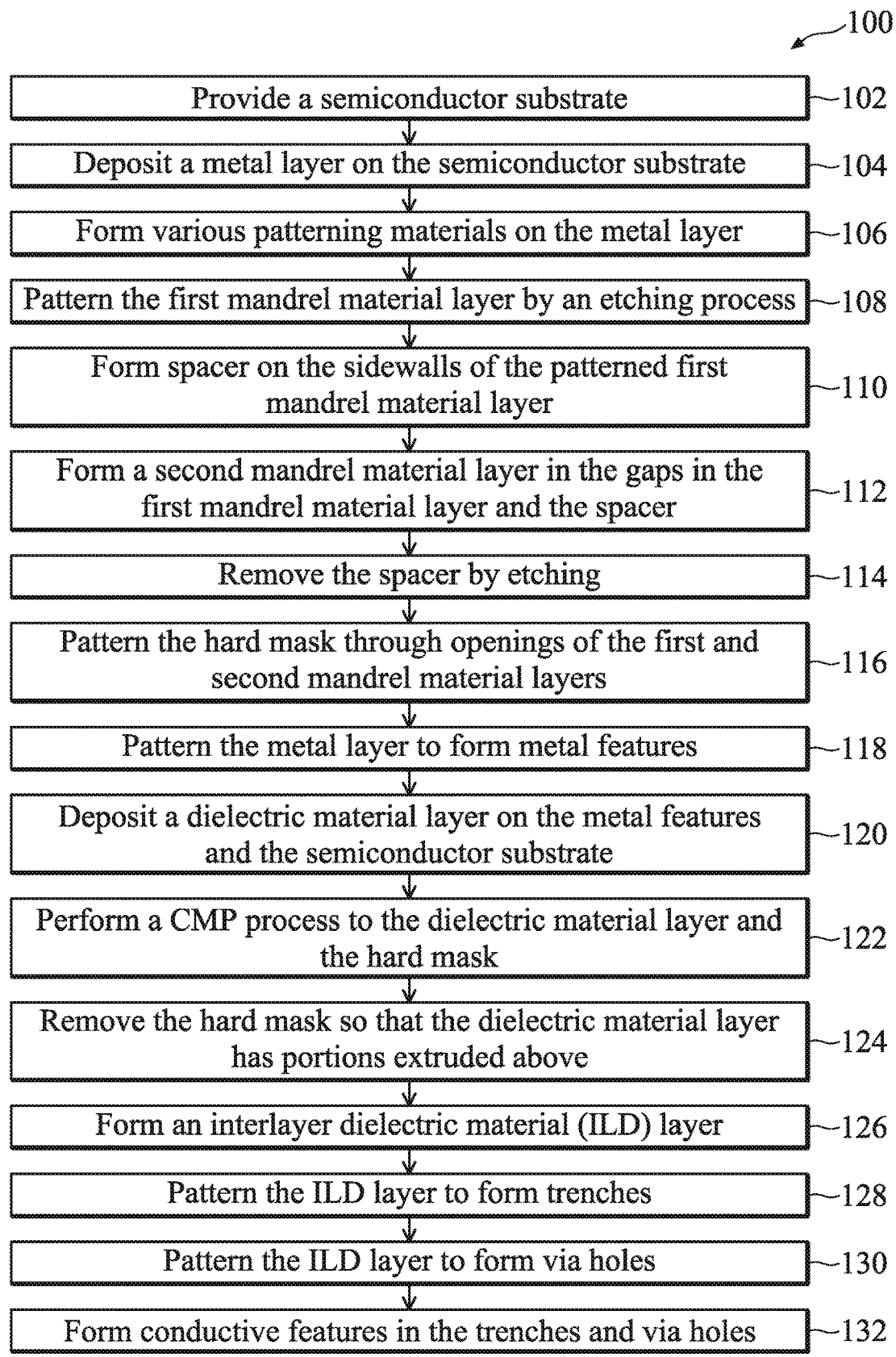
FIG. 1 is a flowchart of a method making a semiconductor structure constructed according to various aspects of the present disclosure in some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 2A:
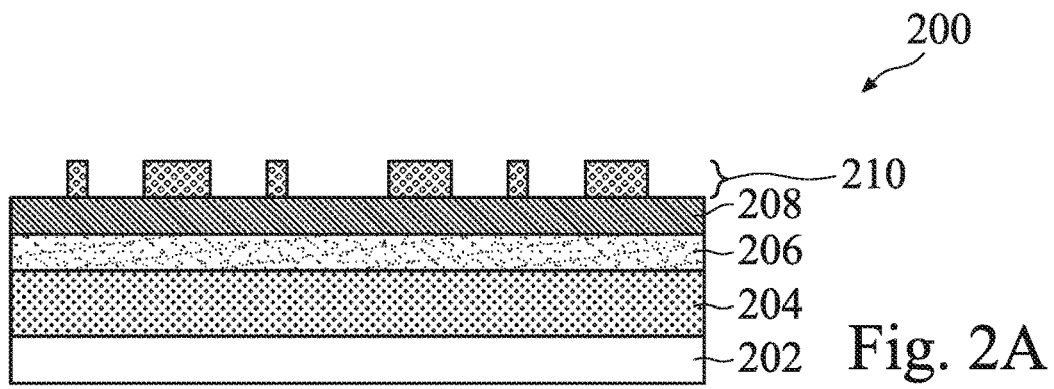
FIGS. 2A, 2B, 2C, 2D, 2E, 2F, 2G, 2H, 2I, 2J, 2K, 2L, 2M, 2N, 2O, 2P and 2Q are sectional views of a semiconductor structure at various fabrication stages constructed according to some embodiments.

The present disclosure provides an interconnection structure having self-aligned conductive features and a method making the same in accordance with various embodiments. FIG. 1 is a flowchart of a method 100 for fabricating a semiconductor structure 200 having an interconnection structure constructed according to some embodiments. FIGS. 2A-2Q are sectional views of the semiconductor structure 200 at various fabrication stages. In some embodiments, the semiconductor structure 200 includes fin active regions, fin transistors formed thereon and an interconnection features coupling the transistors to a functional circuit. The semiconductor structure 200 and the method 100 making the same are collectively described below with reference to FIGS. 1, 2A through 2Q.

Referring to FIG. 2A, the method 100 begins with block 102 by providing a semiconductor substrate 202. The semiconductor substrate 202 includes silicon. In some other embodiments, the semiconductor substrate 202 includes germanium, silicon germanium or other proper semiconductor materials. The semiconductor substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the semiconductor substrate 202 may be a semiconductor on insulator, such as silicon on insulator (SOI).

The semiconductor structure 200 also includes various doped regions, such as n-type doped wells, p-type doped wells and various isolation features formed in the semiconductor substrate 202 surrounding the n-type wells and p-type wells and isolating those from each other. The isolation features may include shallow trench isolation (STI) features, or other suitable isolation features. In some embodiments, the STI features are formed etching to form trenches, filling the trenches with dielectric material and polishing to remove the excessive dielectric material and planarize the top surface. One or more etching processes are performed on the semiconductor substrate 202 through openings of soft mask or hard mask, which are formed by lithography patterning and etching. The semiconductor structure 200 includes active regions, such as fin active regions extruded from the semiconductor substrate 202, or alternatively planar active regions defined in the semiconductor substrate 202 surrounded by the STI features.

The semiconductor structure 200 further includes various devices formed on the active regions, such as fin field-effect transistors (FinFETs), each including a source and a drain formed on an active region, a channel formed on the active region interposed between the source and drain, and a gate disposed on the channel. The semiconductor structure 200 may also include other active devices, passive devices, memory devices or a combination thereof. The semiconductor structure 200 may further includes a portion of an interconnection structure, such as contacts, vias and metal lines.

Still referring to FIG. 2A, the method 100 proceeds to an operation 104 by forming a metal layer 204 by physical vapor deposition (CVD), physical vapor deposition (PVD), atomic layer deposition (ALD), other suitable deposition technique or a combination thereof. In the present embodiment, the metal layer 204 includes ruthenium (Ru), molybdenum (Mo), tungsten (W), other suitable metal, a combination thereof. The metal layer 204 has a proper thickness for conductive features, such as vias coupling to the underlying gates, sources and drains of the underlying transistors. For example, the metal layer 204 includes a thickness ranging between 100 Angstrom and 250 Angstrom. In some embodiments, the metal layer 204 is patterned to form contacts to sources, drains and/or gates. However, it is understood that this is only served as one example for illustration.

Still referring to FIG. 2A, the method 100 proceeds to an operation 106 by forming various patterning materials on the metal layer 204. In the operation 106, a hard mask 206 is formed on the metal layer 204. In the present embodiment, the hard mask 206 is a metal-containing hard mask, such as titanium nitride (TiN), tungsten-doped-carbon (WdC, which provides good etch selectivity especially to a low-k dielectric material), other suitable metal-containing material or a combination thereof. The hard mask 206 may be deposited by PVD, CVD, ALD, other suitable deposition technique or a combination thereof. In some embodiments, the hard mask 206 includes a thickness ranging between 100 Angstrom and 250 Angstrom.

The operation 106 also includes forming a first mandrel material layer 208 on the hard mask 206. The first mandrel material layer 208 is employed for multiple patterning to achieve patterning with reduced pitches, which will be further described through the following operations. In some embodiments, the first mandrel material layer 208 includes amorphous silicon, silicon nitride, other suitable material or a combination thereof. The material of the first mandrel material layer 208 is chosen to have etch selectivity from other materials including the underlying hard mask 206.

The operation 106 also includes forming a patterned resist 210 on the first mandrel material layer 208. The patterned photoresist (or simply referred to as resist) 210 includes openings according to the design layout, such as a design pattern defined on a photomask. The resist 210 includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as a lithographic process. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing.

Figure 2B:
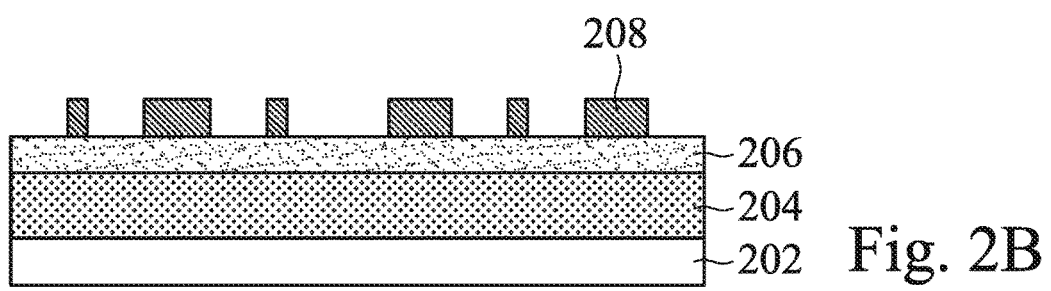

Referring to FIG. 2B, the method 100 proceeds to an operation 108 to pattern the first mandrel material layer 208 through the openings of the resist 210 by an etching process. The etching process to pattern the first mandrel material layer 208 may include wet etching, dry etching or a combination thereof. The etching process may include multiple etching steps. For example, the silicon nitride film in the hard mask layer may be etched by a phosphoric acid solution. After the etching process, the resist 210 may be removed by wet stripping or plasma ashing.

Figure 2C:
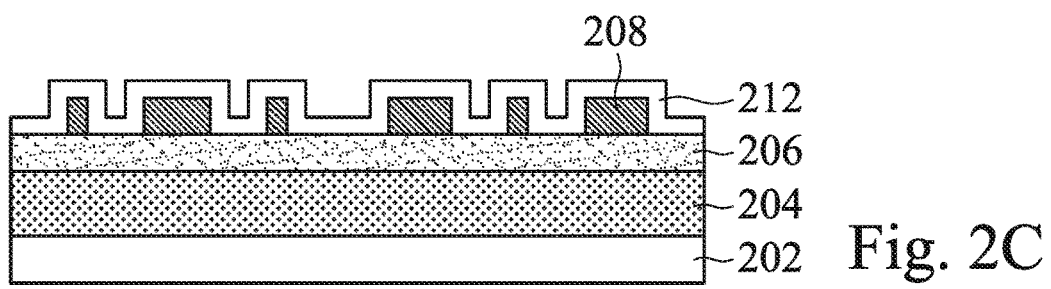
Figure 2D:
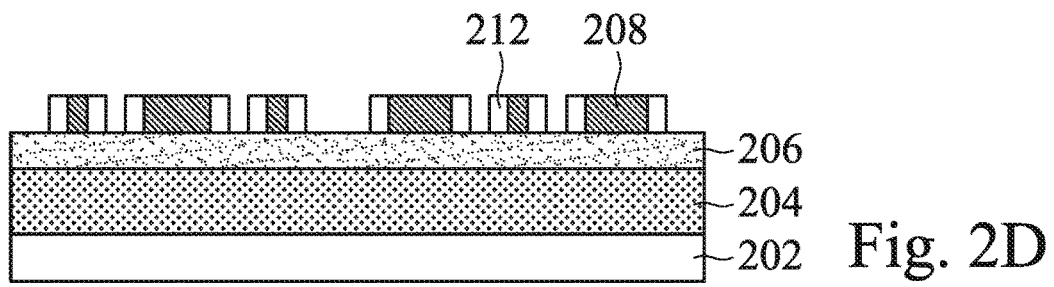

Referring to FIGS. 2C and 2D, the method 100 proceeds to an operation 110 to form spacer 212 on sidewalls of the patterned first mandrel material layer 208. The spacer 212 may include any suitable material, such as metal oxide. In various examples, the spacer 212 includes titanium oxide (TiO), aluminum oxide, other suitable metal oxide, or a combination thereof. The operation 110 includes deposition and anisotropic etching. A first spacer material is first deposited on the patterned first mandrel material layer 208 and the hard mask 206 by a suitable deposition technique, such as ALD, CVD, other suitable deposition or a combination thereof, as illustrated in FIG. 2C. Then an anisotropic etching process, such as plasma etching, is applied to the first spacer material. The anisotropic etching process is substantially directional toward the semiconductor substrate 202 so that portions of the first spacer material on the top surfaces of the first mandrel material layer 208 and on the top surfaces of the hard mask 206 are removed, as illustrated in FIG. 2D. In some embodiments, a chlorine-based gas is used as etchant. The thickness of the spacer 212 is determined according to final dimensions of the metal features to be formed in the metal layer 204, as will be clear through the following description. In some embodiments, the spacer 212 includes a thickness ranging between 10 Angstrom and 50 Angstrom.

Figure 2E:
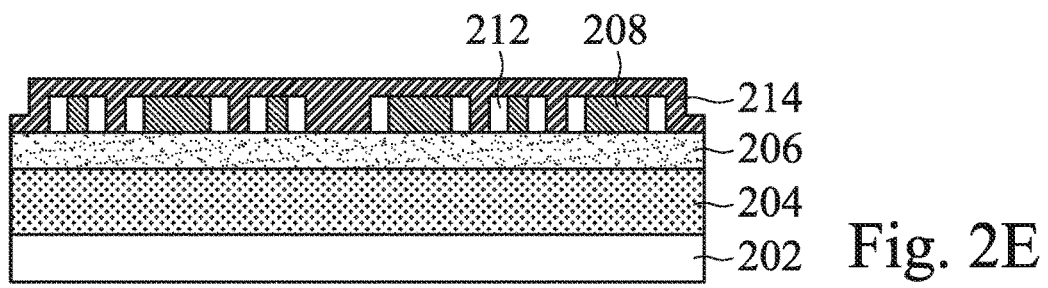
Figure 2F:
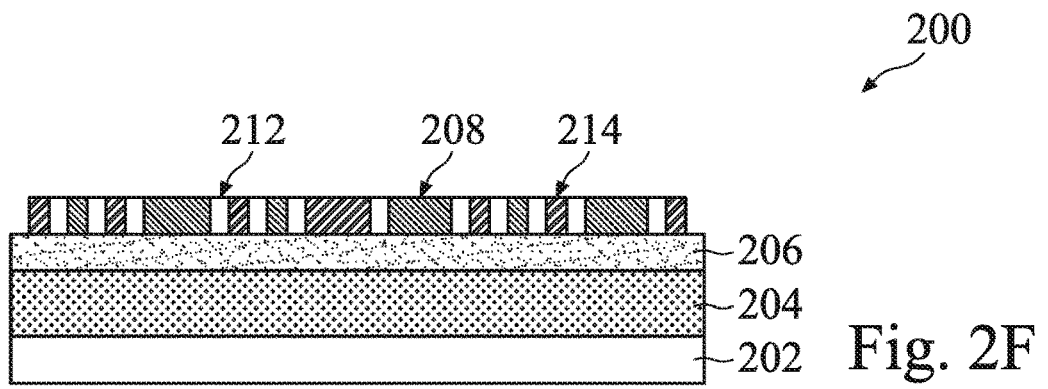

Referring to FIGS. 2E and 2F, the method 100 proceeds to an operation 112 to form a second mandrel material layer 214 in the gaps defined by the first mandrel material layer 208 and the spacer 212. The second mandrel material layer 214 may include metal oxide (such as titanium oxide, zirconium oxide or aluminum oxide), oxygen-doped carbide (ODC) for high selectivity of deposition and/or etch, other suitable material, or a combination thereof. The second mandrel material layer 214 is formed by a suitable deposition technique, such as ALD, CVD, PVD, other suitable deposition technique, or a combination thereof. In some embodiments, the second mandrel material layer 214 is deposited by a selective deposition with a process control (such as deposition time) so that the second mandrel material layer 214 is properly filled in the gaps and with a top surface being substantially coplanar with the top surface of the first mandrel material layer 208 and the spacer 212. Alternatively, the second mandrel material layer 214 is formed by a procedure that includes deposition to fill the gaps, as illustrated in FIG. 2E; and a chemical mechanical polishing (CMP) process to remove the top portions and planarize the top surface, as illustrated in FIG. 2F. The second mandrel material layer 214 is deposited with a thickness great enough to completely fill the gaps. For example, the thickness may range between 10 Angstrom and 50 Angstrom. However, the real thickness of the second mandrel material layer 214 in the gaps is similar to that of the first mandrel material layer 208, such as ranging between 50 Angstrom and 200 Angstrom.

Figure 2G:
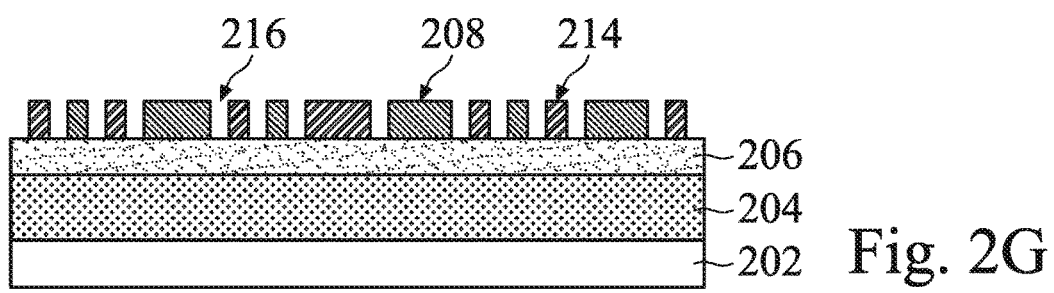

Referring to FIG. 2G, the method 100 proceeds to an operation 114 to remove the spacer 212 by etching, such as by a wet etching with a suitable etchant including chlorine-based gas or fluorine-based gas (depending on composition of hard mask), leaving openings 216 defined by the first and second mandrel material layers 208 and 214. The first and second mandrel material layers 208 and 214 collectively define a pattern for the metal features to be formed in the metal layer 204.

Figure 2H:
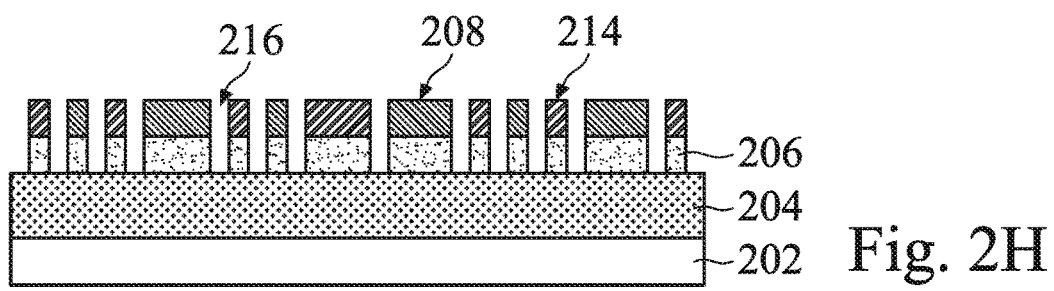
Figure 2I:
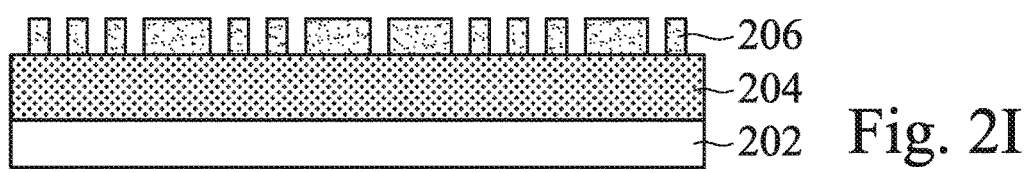

Referring to FIGS. 2H and 2I, the method 100 proceeds to an operation 116 to pattern the hard mask 206 by an etching process using an etchant including CxFy (such as $CF_4$, $CH_2F_2$, $CCl_2F_2$) through the openings 216 using the first and second mandrel material layer 208 and 214 collectively as an etch mask, thereby forming a patterned hard mask 206, as illustrated in FIG. 2H. The first and second mandrel material layers 208 and 214 may be removed thereafter by another etching process, such as one or two wet etching steps, such as an etchant including $B_3$ and deionized (DI) water and Isopropyl alcohol (IPA), as illustrated in FIG. 2I.

Figure 2J:
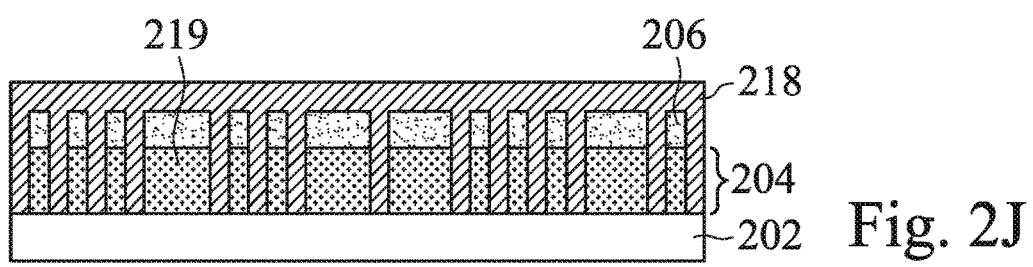

Referring to FIG. 2J, the method 100 proceeds to an operation 118 to pattern the metal layer 204 by an etching process, such as a dry etchant using an etchant including $CH_4$, $CH_2$, Ar, He or a combination thereof, or an additional wet etch through the openings of the patterned hard mask 206, thereby forming metal features 219 (such as vias, contacts or metal lines) in the metal layer 204.

Still referring to FIG. 2J, the method 100 proceeds to an operation 120 to depositing a dielectric material layer 218 into the gaps of the patterned metal layer 204. The dielectric material layer 218 completely fills in the gaps of and disposed on the patterned metal layer 204 as well. The dielectric material layer 218 is chosen such that the dielectric material layer 218 has an etch selectivity to the subsequently deposited dielectric material for self-alignment, as further described below with other operations. In some examples, the dielectric material layer 218 includes low-k dielectric material, silicon oxide, silicon nitride, silicon oxynitride, metal oxide, metal nitride, metal oxynitride, other suitable dielectric material, or a combination thereof. The dielectric material layer 218 is chosen with lower dielectric constant for reduced capacitance and enough hardness to prevent from etch damage. In some example, the dielectric material layer 218 is deposited with a thickness great enough to completely fill the gaps of the patterned metal layer 204. For example, the thickness may range between 500 Angstrom and 1000 Angstrom. However, the real thickness of the dielectric material layer 218 in the gaps substantially equals to or greater than the thickness of the metal layer 204 and the thickness of the hard mask 206.

Figure 2K:
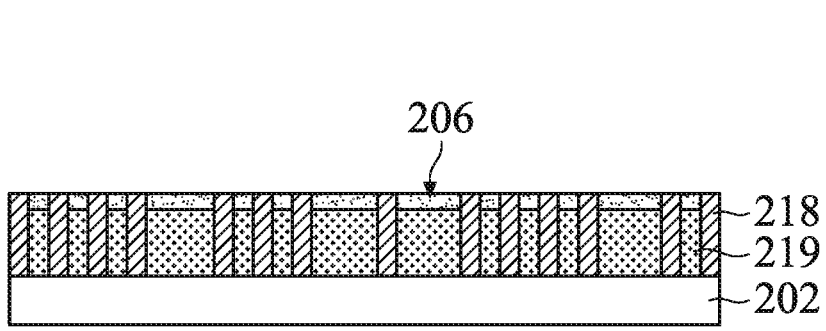

Referring to FIG. 2K, the method 100 proceeds to an operation 122 to perform a CMP process to the dielectric material layer 218 and the hard mask 206 so that both are recessed and planarized. Particularly, top portions of the dielectric material layer 218 is completely removed by the CMP process so that the hard mask 206 is exposed and the CMP process continues to further remove top portions of the hard mask 206 so that the dielectric material layer 218 has portions with enough thickness above the metal layer 204 to achieve self-alignment. In the present example, after the completion of the CMP process, the remaining thickness of the hard mask 206 ranges between 100 Angstrom and 150 Angstrom. Alternatively, the operation 122 may be achieved by a recessing process to substantially equally recess both the dielectric material layer 218 and the hard mask 206, such as by an etching process with an etchant tuned to substantially equally etch both the dielectric material layer 218 and the hard mask 206.

Figure 2L:
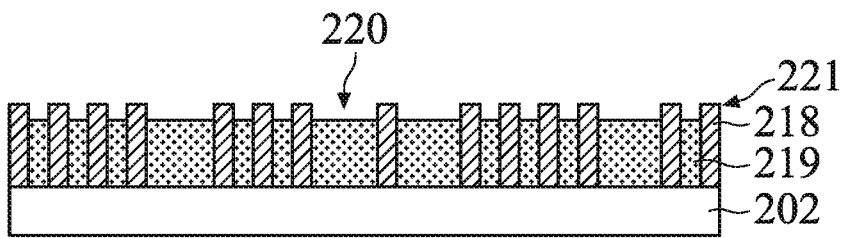

Referring to FIG. 2L, the method 100 proceeds to an operation 124 to remove the hard mask 206 by an etching process to selectively etch the material of the hard mask 206 relative to the dielectric material layer 218 and the metal layer 204, leaving recesses 220 on the metal layer 204 and surrounded by the extruded portions of the dielectric material layer 218. In some embodiment, hydrofluoric acid is used with a suitable concentration. Those extruded portions (also referred to gating posts) 221 of the dielectric material layer 218 functions as gating to constrain the subsequent etching process to be self-aligned with the metal features 219. For this purpose, the gating posts 221 need to have proper dimensions, such as height H and width W, and furthermore a ratio of height over width H/W. In the present embodiments, the ratio H/W is greater than 3 or ranges between 2 and 6. In other embodiments, the height of the gating posts 221 is greater than 10 Angstrom.

The dielectric material layer 218 includes post portions each being inserted between two adjacent metal features 219 and being extended above the metal features 219. Each post portion is vertically extended from the bottom surface of the metal features 219 to above the top surface of the metal features 219. Especially, each post portion has a same width from the bottom to the top and has vertical sidewalls.

Figure 2M:
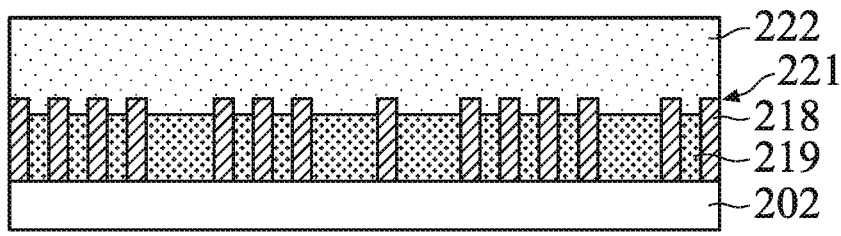

Referring to FIG. 2M, the method 100 proceeds to an operation 126, in which an inter-level dielectric material (ILD) layer 222 is formed on the metal layer 204 and the dielectric material layer 218. The ILD layer 222 may include any suitable dielectric material, such as a semiconductor oxide, a semiconductor nitride, a semiconductor oxynitride, low-k dielectric material, other suitable dielectric materials, or combinations thereof. In some embodiments, the formation of the ILD layer 222 includes deposition and CMP to provide a planarized top surface. In some embodiments, the ILD layer 222 may additionally include an etch stop layer (not shown in FIG. 2M) on the bottom with a dielectric material having a higher etch resistance than the material of the ILD layer 222. For example, the etch stop layer may include silicon nitride. In some examples, the ILD layer 222 includes a thickness ranging between 800 Angstrom and 1200 Angstrom.

Afterward, conductive features are formed in the ILD layer 222, aligned with and landed on metal features in the metal layer 204. In the present embodiment, the conductive features in the metal layer 204 are contacts landing on devices (such as sources, drains and gates of FETs) while the overlying conductive features to be formed in the ILD layer 222 includes vias and metal lines. These are, of course, merely examples and are not intended to be limiting. In furtherance of the embodiment, the vias and metal lines are formed by a dual damascene process, which is further described in detail.

Figure 2N:
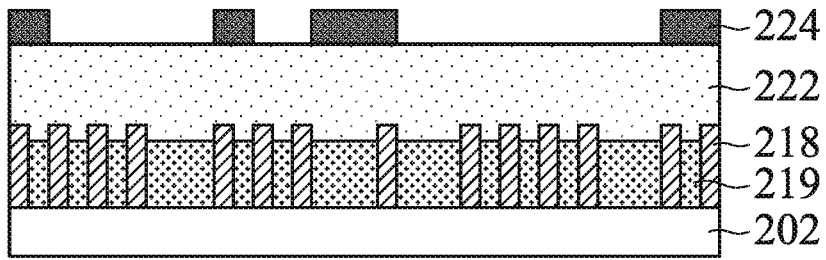
Figure 2O:
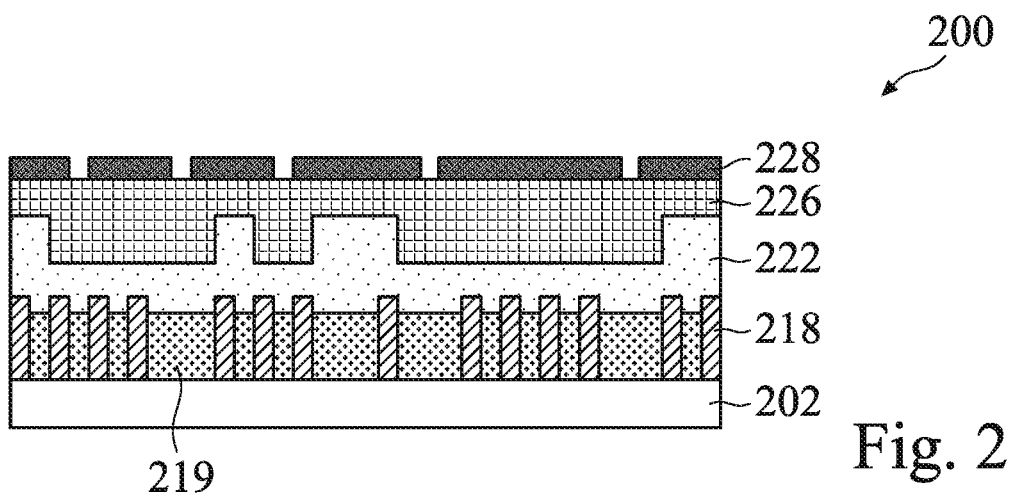

Referring to FIGS. 2N and 2O, the method 100 proceeds to an operation 128 to form trenches in the ILD layer 222 for metal lines. The operation 128 includes a lithography process to form a patterned resist 224 with openings to define regions of metal lines, as illustrated in FIG. 2N. The operation 128 further includes an etching process to etch the ILD layer 222 through the openings of the patterned resist 224, thereby forming trenches in the ILD layer 222, as illustrated in FIG. 2O. Especially, the etching process includes an etchant to selectively etch the ILD layer 222 without etching the dielectric material layer 218. In some embodiments, the etching process includes a dry etching process using etchant including fluorocarbon radicals (such as $CF_4$) and oxygen ($O_2$).

Figure 2P:
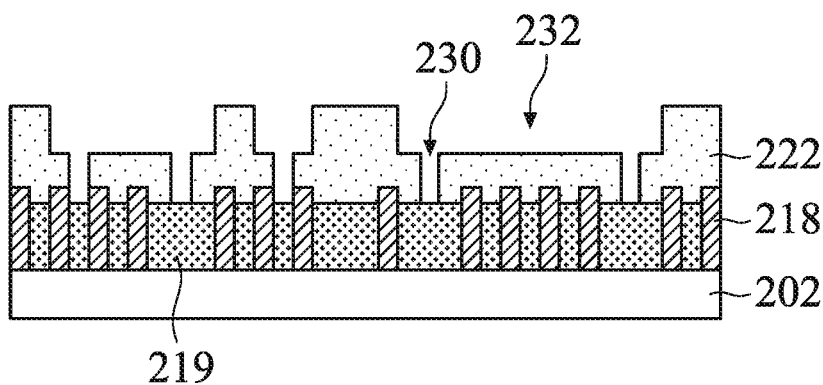
Figure 2Q:
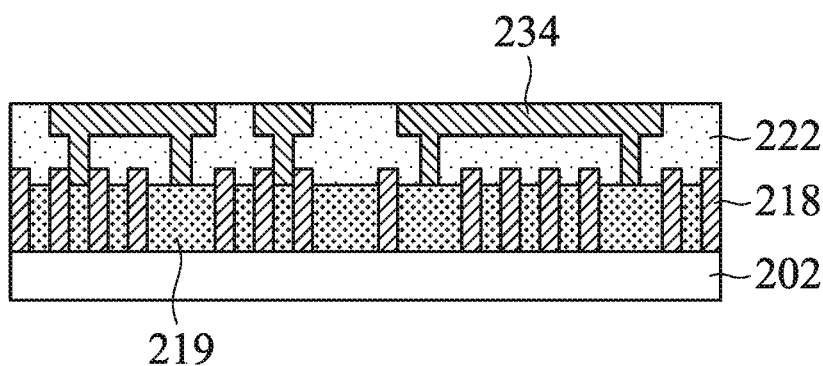

Referring to FIGS. 2O and 2P, the method 100 proceeds to an operation 130 to form via holes in the ILD layer 222 for via features. The operation 130 includes a lithography process to form a patterned resist 228 with openings to define regions for via features and an etching process applied to the ILD layer 222 to form via holes. The operation 130 also includes forming a bottom layer 226 before forming the patterned resist 228, as illustrated in FIG. 2O. The bottom layer 226 may include a suitable material, such as carbon-rich dielectric material (e.g., carbon-rich silicon oxide or carbon-rich silicon nitride), a bottom anti-reflective coating (BARC) layer, a resist material being absent of photo-sensitive chemical, other suitable organic material. In one embodiment, the bottom layer 226 is formed by spin-on coating and is further baked. The bottom layer 226 completely fills in the trenches in the ILD layer 222 with a planarized top surface for better resolution and quality of the resist during the exposure process.

As described above, the operation 130 further includes an etching process to etch the ILD layer 222 (and the bottom layer 226 as well) through the openings of the patterned resist 228, thereby forming via holes 230 in the ILD layer 222. The patterned resist 228 and the bottom layer 226 may be removed after the etching process. Thus, the via hole 230 and trenches 232 are formed in the ILD layer by a dual damascene process, as illustrated in FIG. 2P. The etching process in the operation 130 uses an etchant to have an etch selectivity similar to that of the etching process in the operation 128. For example, the etching process uses a dry etching process using an etchant including fluorocarbon radicals and oxygen.

During the etching process to form the via holes 230, the etching process is designed to etch the ILD layer 222 to form the via holes aligned with the metal features 219. However, the lithography process in the operation 130 may have misalignment, leading the via holes shifting sideways. This may cause a via hole shift to an adjacent metal feature 219, therefore introducing bridging or other quality and reliability issues. As noted above, the extruded portions (the gating posts 221) of the dielectric material layer 218 functions as gating to constrain the etching process to be self-aligned with the metal features 219. For example, when a via hole is shifting to the region out of underling metal feature 219, the etching process is applied to the dielectric material layer 218 that is chosen to have high etch resistance and stops the etching from further extending to the adjacent metal features, forces the via hole to be aligned with the underlying metal feature, and eliminate the bridging issue.

Referring to FIG. 2Q, the method 100 proceeds to an operation 132 to form conductive features 234 in the trenches 232 and via holes 230. In the present embodiment, the conductive features 234 include via features in the via holes 230 and the metal lines in the trenches 232. The operation 132 includes depositing a conductive material to fill in the via holes 230 and the trenches 232, and a CMP process to remove the excessive conductive material on the ILD layer 222 and planarize the top surface, as illustrated in FIG. 2Q. The conductive features 234 include metal, metal alloy, other suitable conductive material or a combination thereof. In some examples, the conductive features 234 include copper, tungsten, ruthenium, nickel or a combination thereof. In some example, the conductive features 234 further include a barrier layer formed on the sidewalls of the trenches 232 and via holes 230. The barrier layer may include titanium and titanium nitride, tantalum and tantalum nitride, or other suitable material. The method 100 may further include forming other portions of the interconnection structure. For example, when the conductive features 234 include metal lines in the first metal layer and vias coupling the metal lines to the contacts, the method 100 resume to form metal lines and vias in the second metal layer, the third metal layer and so on.

In the method 100, the dual damascene process includes a process that forms the trenches first and forms the via holes thereafter. However, the dual damascene process may alternatively form the via holes first and forms the trenches thereafter, such as one described below.

Figure 3:
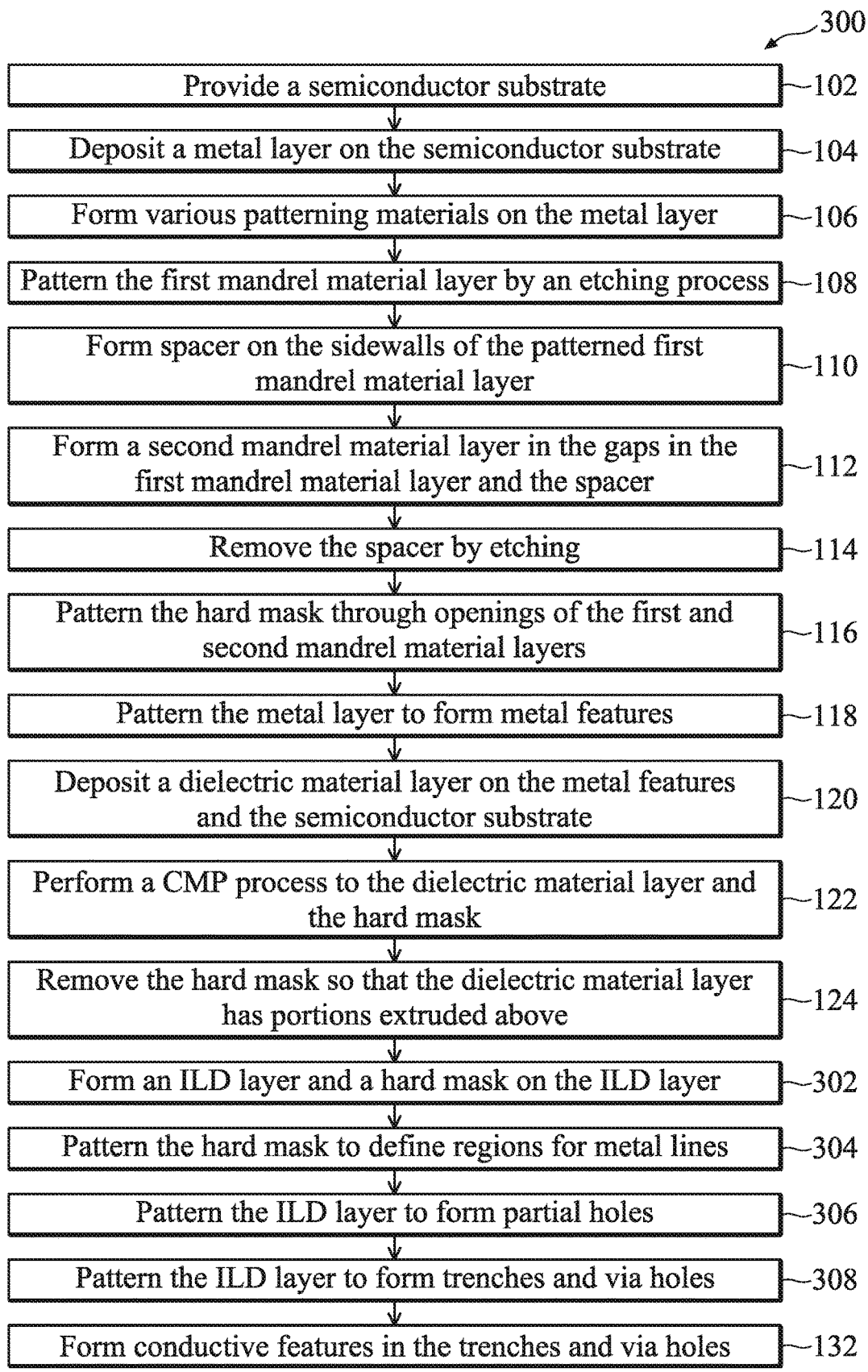
FIG. 3 is a flowchart of a method making a semiconductor structure constructed according to various aspects of the present disclosure in some embodiments.
Figure 4A:
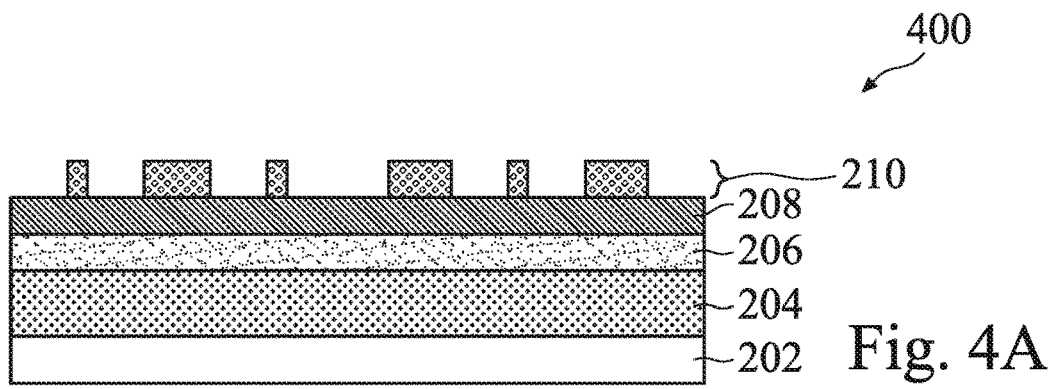
FIGS. 4A, 4B, 4C, 4D, 4E, 4F, 4G, 4H, 4I, 4J, 4K, 4L, 4M, 4N, 4O, 4P, 4Q and 4R are sectional views of a semiconductor structure at various fabrication stages constructed according to some embodiments.
Figure 4B:
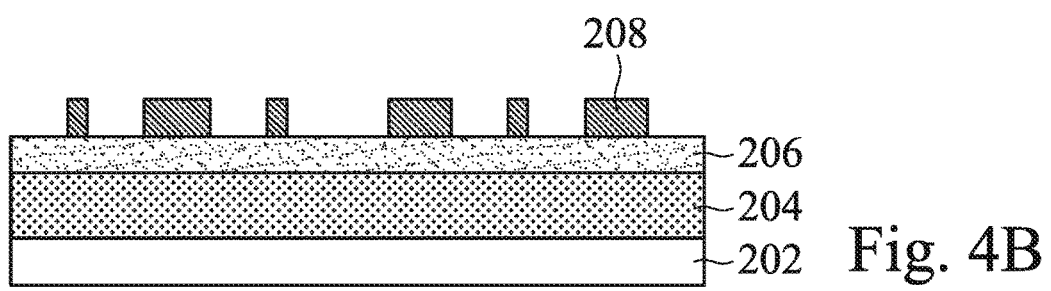
Figure 4C:
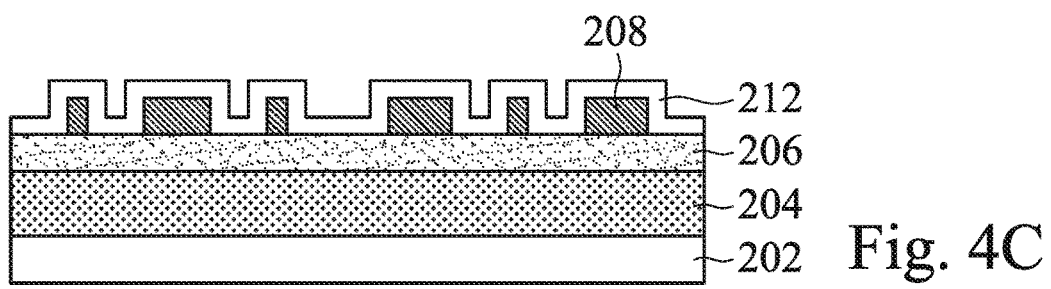
Figure 4D:
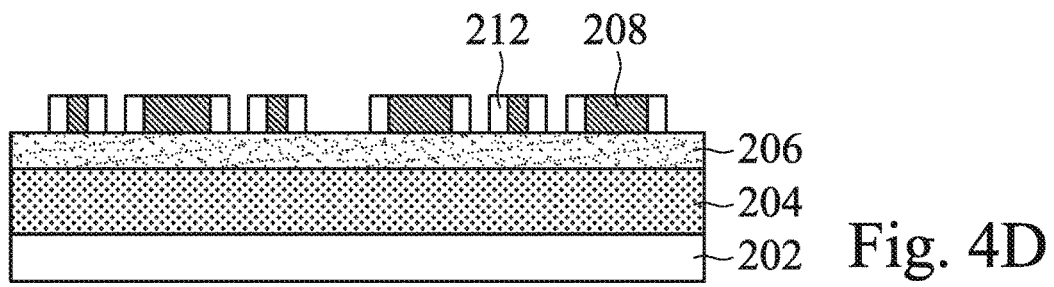
Figure 4E:
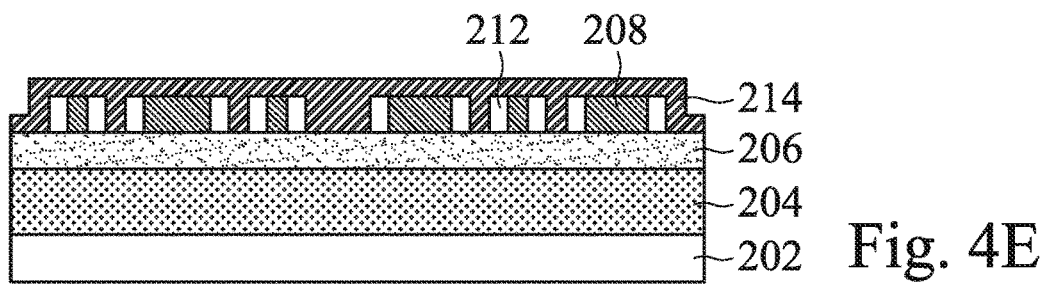
Figure 4F:
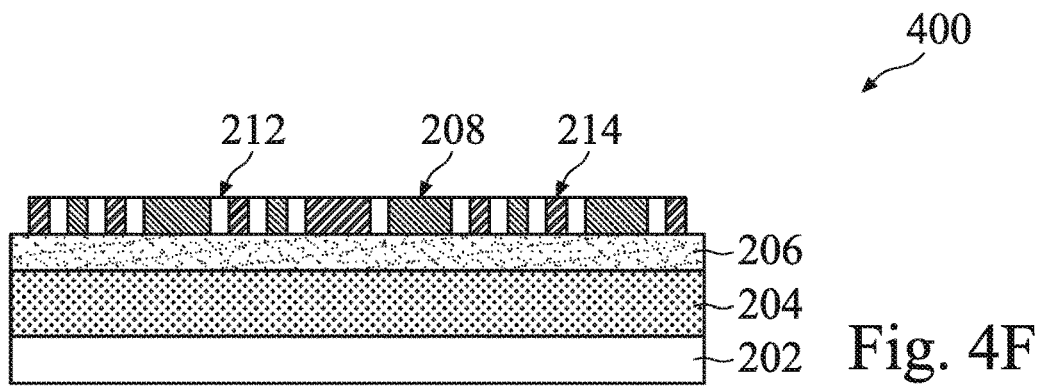
Figure 4G:
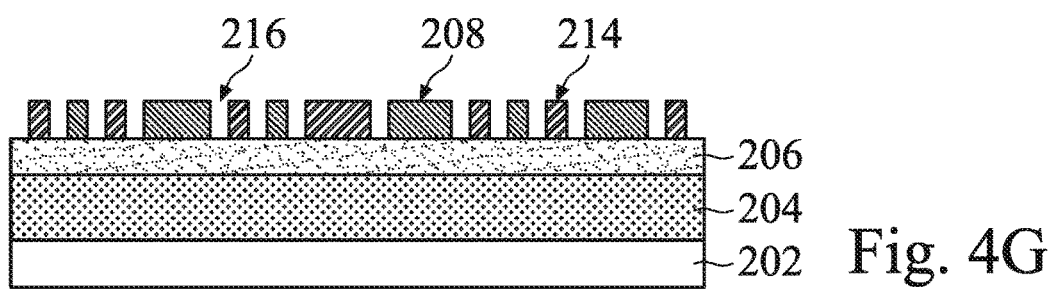
Figure 4H:
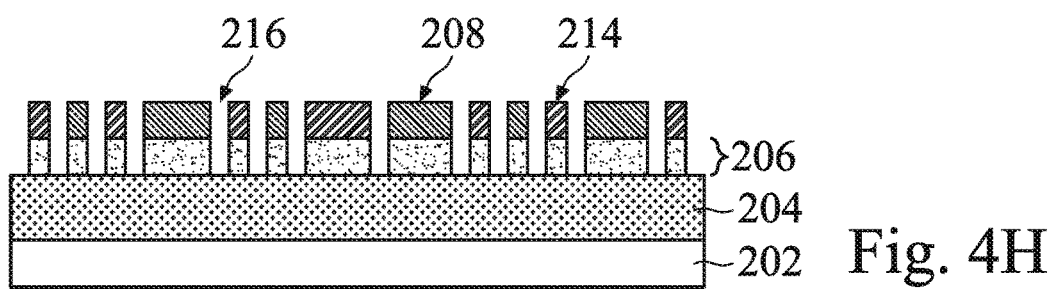
Figure 4I:
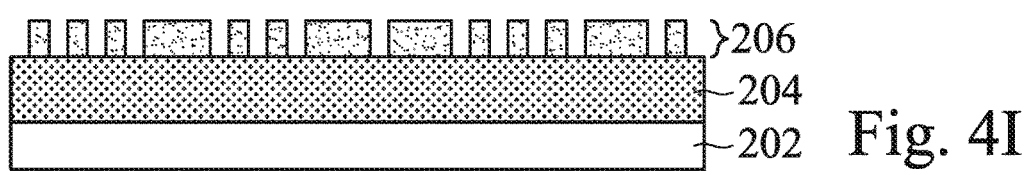
Figure 4J:
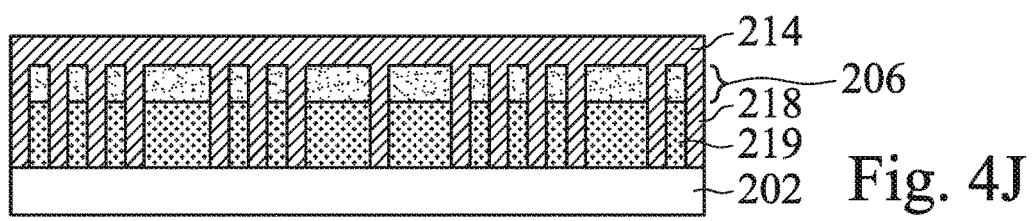
Figure 4K:
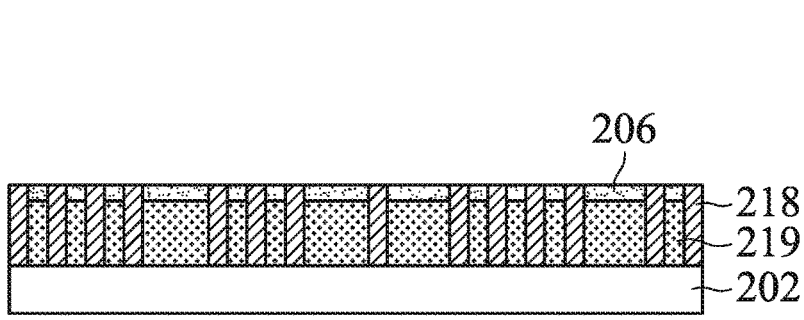
Figure 4L:
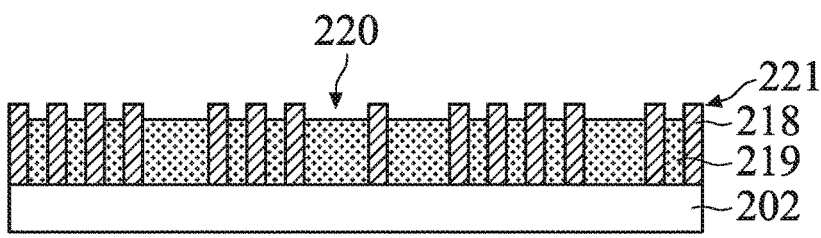

FIG. 3 is a flowchart of a method 300 for fabricating a semiconductor structure 400 having an interconnection structure constructed according to some embodiments. FIGS. 4A~4R are sectional views of the semiconductor structure 400 at various fabrication stages. In some embodiments, the semiconductor structure 400 includes fin active regions, fin transistors formed thereon and an interconnection features coupling the transistors to a functional circuit. The semiconductor structure 400 and the method 300 making the same are collectively described below with reference to FIGS. 3, 4A through 4R. The method 300 is similar to the method 100 except for last few operations for damascene process. The descriptions for those similar operations (102 to 124) are not repeated.

Figure 4M:
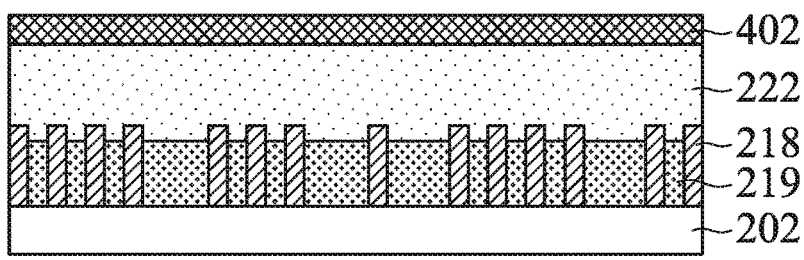

Referring to FIG. 4M, the method 300 proceeds to an operation 302, in which an ILD layer 222 is formed on the metal layer 204 and the dielectric material layer 218. The ILD layer 222 may include any suitable dielectric material, such as silicon oxide, silicon nitride, silicon oxynitride, low-k dielectric material, other suitable dielectric materials, or combinations thereof. In some embodiments, the formation of the ILD layer 222 includes deposition and CMP to provide a planarized top surface. In some embodiments, the ILD layer 222 may additionally include an etch stop layer (not shown in FIG. 4M) on the bottom with a dielectric material having a higher etch resistance than the material of the ILD layer 222. In the operation 302, a hard mask 402 is additionally formed on the ILD layer 222. The hard mask 402 has a composition different from that of the ILD layer 222 so to have an etch selectivity during the later etching process to form trenches in the ILD layer 222. For example, the hard mask 402 includes silicon nitride, metal-containing material (such as aluminum oxide), other suitable material or a combination thereof. The hard mask 402 has a thickness greater enough to survive the later etching process to form trenches in the ILD layer 222. In some examples, the hard mask 402 has a thickness ranging between 100 Angstrom and 500 Angstrom.

Figure 4N:
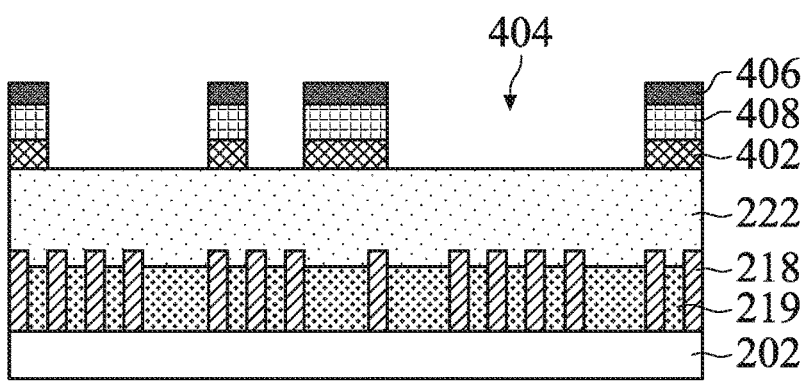

Referring to FIG. 4N, the method 300 proceeds to an operation 304 to pattern the hard mask 402 with openings 404 that define regions for metal lines to be formed in the ILD layer 222. The operation 304 includes a lithography process to form a patterned resist layer 406 on the hard mask 402. In the present embodiment, the operation 304 also includes forming a bottom layer 408 underlying the resist layer 406. The bottom layer 408 is similar to the bottom layer 226 in terms of formation and composition. The operation 304 further includes an etching process to etch the hard mask 402 through the openings of the patterned resist 406, as illustrated in FIG. 4N. Thereafter, the resist 406 and the bottom layer 408 are removed by a proper procedure, such as wet stripping or plasma ashing.

Figure 4O:
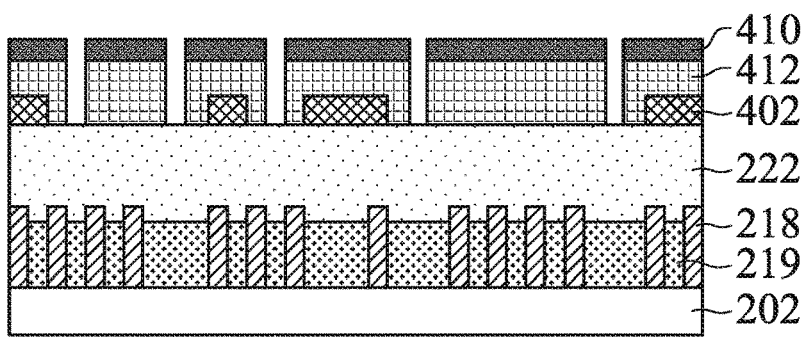
Figure 4P:
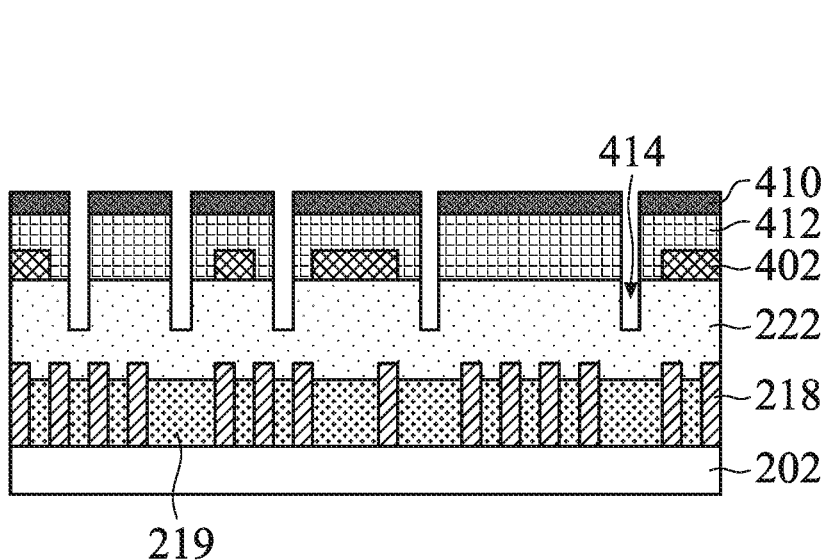

Referring to FIGS. 4O and 4P, the method 300 proceeds to an operation 306 to form holes 414 in the ILD layer 222 that define regions for via features. The operation 306 includes a lithography process to form a patterned resist 410 with openings to define regions for via features. The operation 306 also includes forming a bottom layer 412 before forming the patterned resist 410, as illustrated in FIG. 4O. The bottom layer 412 is similar to the bottom layer 226 or 408. In one embodiment, the bottom layer 412 is formed by spin-on coating and is further baked. The bottom layer 412 completely fills in the openings of the hard mask 402 with a planarized top surface for better resolution and quality of the resist during the exposure process.

The operation 306 further includes an etching process to etch the ILD layer 222 (and the bottom layer 412 as well) through the openings of the patterned resist 410, thereby forming holes 414 in the ILD layer 222. The holes 414 are partially extending not through the ILD layer 222, such as half-through, as illustrated in FIG. 4P. This can be controlled by etching time or other suitable means. Thereafter, the resist 410 and the bottom layer 412 are removed by a proper procedure, such as wet stripping or plasma ashing.

Figure 4Q:
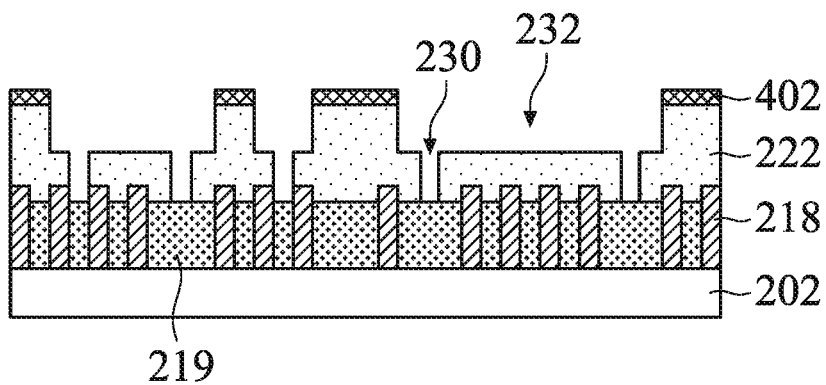
Figure 4R:
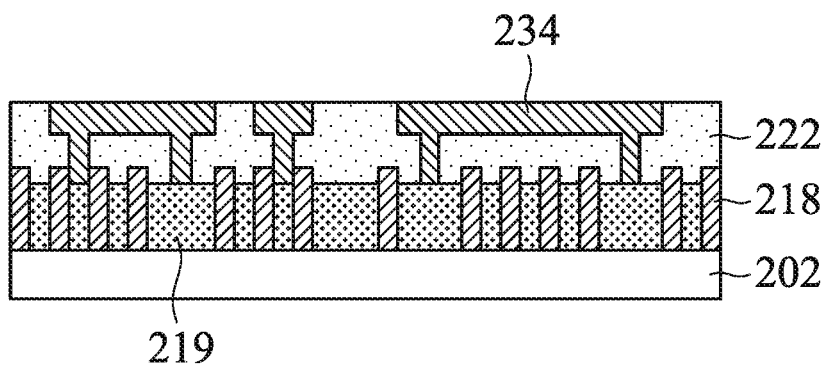

Referring to FIG. 4Q, the method 300 proceeds to an operation 308 to perform an etching process to the ILD layer 222 through the openings of the hard mask 402, thereby forming both the via holes 230 and trenches 232 in the ILD layer 222. The etching process recesses the ILD layer 222 evenly so that the trenches 232 are formed and the holes 414 are deepened to through via holes 230 with the metal features 219 are exposed therewithin.

Similarly, the etching process is designed to etch the ILD layer 222 to form the via holes 230 aligned with the metal features 219. However, the misalignment of the lithography process in the operation 304 may cause the via holes shifting sideways and introduce bridging issues. The extruded portions of the dielectric material layer 218 functions as gating to constrain the etching process to be self-aligned with the metal features 219, as explained above.

Referring to FIG. 4R, the method 300 proceeds to an operation 132 to form conductive features 234 in the trenches 232 and via holes 230. In the present embodiment, the conductive features 234 include via features in the via holes 230 and the metal lines in the trenches 232. The operation 132 includes depositing a conductive material to fill in the via holes 230 and the trenches 232, and a CMP process to remove the excessive conductive material on the ILD layer 222 and planarize the top surface. The conductive features 234 include metal, metal alloy, other suitable conductive material or a combination thereof. In some examples, the conductive features 234 include copper, tungsten, ruthenium, nickel or a combination thereof. In some examples, the conductive features 234 further include a barrier layer formed on the sidewalls of the trenches 232 and the via holes 230. The barrier layer may include titanium and titanium nitride, tantalum and tantalum nitride, or other suitable material.

Other fabrication operations may be implemented before, during and after the operations of the method. Some operations may be implemented by an alternative operation. For example, a patterning process may be implemented through other double patterning or multiple patterning. In some embodiments, the metal features 219 are contacts, silicide may be formed on the source/drain features to further reduce the contact resistance before the metal layer 204 is deposited. The silicide includes silicon and metal, such as titanium silicide, tantalum silicide, nickel silicide or cobalt silicide. The silicide may be formed by a process referred to as self-aligned silicide. The process includes metal deposition, annealing to react the metal with silicon, and etching to remove unreacted metal. In some embodiments, various components (such as metal features 219 and/or conductive features 234) of the interconnection structure may include any suitable conductive material, such as molybdenum (Mo), tungsten (W), ruthenium (Ru), aluminum (Al), aluminum alloy, copper (Cu), cobalt (Co), nickel (Ni), silicide, other suitable metal/metal alloy, or a combination thereof.

Other structure may be achieved within the scope of the present disclosure. In some embodiments, the semiconductor structure 200 (or 400) may include single damascene processes to separately form metal lines and vias. In other embodiments, the vias and overlying metal lines may be formed by a procedure that includes both damascene process and metal patterning. For example, after the metal features 219 are formed with the dielectric material layer 218 filling the gaps and extruded above the metal features 219, a single damascene process is used to form via holes in the ILD layer 222 in which the via holes are self-aligned with the metal features 219 due to the gating effect of the extruded portions of the dielectric material layer 218. Then a conductive material (metal or metal alloy) is deposited on the ILD layer 222 and fills in the via holes; and a patterning process (including lithography process and etching) is applied to pattern the conductive material to form metal lines. In the semiconductor structure 200 or 400, the metal features 219 are contacts and the conductive features 234 include vias and metal lines according to the illustrated examples. However, this is not intended to be limiting. In various embodiments, the metal features 219 are vias (or metal lines) while the conductive features 234 are metal lines (or vias, or both overlying vias and metal lines).

The present disclosure provides an interconnection structure and a method making the same in accordance with various embodiments. The method includes patterning a metal layer to form metal features on the substrate; forming a dielectric material layer in the gaps among the metal features such that the dielectric material layer is extruded above the metal features, functioning as gating posts to constrain the subsequent etching so that overlying conductive features are self-aligned with the metal features. Various advantages may present in some embodiments. For example, the disclosed structure and method are compatible with the existing IC structure and method. By using the disclosed method and structure, the overlying conductive features are self-aligned with the underlying the metal features, eliminating the bridging and other reliability issues. Additionally, the damage to the ILD layer is minimized due to the protections of the gating posts. The structure and method may be used to form logic circuits (such as logic circuits, such as NOR, NAND, or Inverter), memory cells (such as static random-access memory (SRAM)) or other circuits.

In one example aspect, the present disclosure provides a method of forming an integrated circuit structure. The method includes depositing a first metal layer on a semiconductor substrate; forming a hard mask on the first metal layer; patterning the first metal layer to form first metal features using the hard mask as an etch mask; depositing a dielectric layer of a first dielectric material on the first metal features and in gaps among the first metal features; performing a chemical mechanical polishing (CMP) process to both the dielectric layer and the hard mask; removing the hard mask, thereby having portions of the dielectric layer extruded above the metal features; forming an inter-layer dielectric (ILD) layer of the second dielectric material different from the first dielectric material; and patterning the ILD layer to form openings that expose the first metal features and are constrained to be self-aligned with the first metal features by the extruded portions of the first dielectric layer.

Another one aspect of the present disclosure pertains to a method of forming an integrated circuit structure. The method includes depositing a first metal layer on a semiconductor substrate; forming a hard mask on the metal layer; patterning the first metal layer to form first metal features using the hard mask as an etch mask; depositing a dielectric layer of a first dielectric material on the first metal features and in gaps among the first metal features; recessing evenly both the dielectric layer and the hard mask; removing the hard mask, thereby having portions of the dielectric layer extruded above the metal features; forming an inter-layer dielectric (ILD) layer of the second dielectric material different from the first dielectric material; patterning the ILD layer to form openings that expose the first metal features; and forming second metal features in the openings of the ILD layer, wherein the second metal features are constrained to be self-aligned with the first metal features by the extruded portions of the dielectric layer and are landing on the first metal features.

Yet another aspect of the present disclosure pertains to a semiconductor structure. The semiconductor structure includes first metal features disposed on a semiconductor substrate; a first dielectric layer disposed in gaps of the first metal features and extruded above a top surface of the first metal features, the first dielectric layer including a first dielectric material; a second dielectric layer disposed on the first dielectric layer, the second dielectric layer including a second dielectric material different from the first dielectric material; and second metal features formed in the second dielectric layer and landing on the first metal features, respectively, wherein a bottom surface of the second metal features is below the top surface of the first dielectric layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit structure, comprising:

depositing a first metal layer on a semiconductor substrate;

forming a hard mask on the first metal layer;

patterning the first metal layer to form first metal features using the hard mask as an etch mask;

depositing a dielectric layer of a first dielectric material on the first metal features and in gaps among the first metal features;

performing a chemical mechanical polishing (CMP) process to both the dielectric layer and the hard mask;

removing the hard mask, thereby having portions of the dielectric layer extruded above the first metal features;

forming an inter-layer dielectric (ILD) layer of a second dielectric material different from the first dielectric material; and patterning the ILD layer to form openings that expose the first metal features and are constrained to be self-aligned with the first metal features by the extruded portions of the dielectric layer.

2. The method of claim 1, further comprising forming second metal features in the openings of the ILD layer, wherein the second metal features are landing on the first metal features.

3. The method of claim 2, wherein the ILD layer includes a low-k dielectric material and the dielectric material includes at least one of silicon oxide, silicon nitride, silicon oxynitride, metal oxide, metal nitride, metal oxynitride and a combination thereof.

4. The method of claim 2, wherein the performing of the CMP process includes recessing both the dielectric layer and the hard mask such that a bottom portion of the hard mask remains.

5. The method of claim 4, wherein the forming of the hard mask on the first metal layer includes depositing a metal-containing hard mask; and patterning the metal-containing hard mask using a lithography process and etching.

6. The method of claim 5, wherein the metal-containing hard mask includes one of titanium nitride and tungsten-doped carbon (WdC).

7. The method of claim 1, wherein the depositing of the first metal layer on the semiconductor substrate includes depositing one of molybdenum (Mo), tungsten (W), and ruthenium (Ru).

8. The method of claim 1, wherein the patterning the ILD layer includes performing an etching process using an etchant containing fluorocarbon radicals and oxygen to selectively etch the ILD layer relative to the dielectric layer.

9. The method of claim 1, wherein the patterning of the first metal layer to form first metal features includes using a spacer patterning process.

10. The method of claim 1, wherein the patterning the ILD layer to form openings includes patterning the ILD layer to form trenches and vias by a dual damascene process.

11. The method of claim 2, wherein the first metal features are contacts landing on transistors; and the second metal features include metal lines.

12. The method of claim 2, wherein the first metal features are vias; and the second metal features include metal lines.

13. A method of forming an integrated circuit structure, comprising:

depositing a first metal layer on a semiconductor substrate;

forming a hard mask on the first metal layer;

patterning the first metal layer to form first metal features using the hard mask as an etch mask;

depositing a dielectric layer of a first dielectric material on the first metal features and in gaps among the first metal features;

recessing evenly both the dielectric layer and the hard mask;

removing the hard mask, thereby having portions of the dielectric layer extruded above the first metal features;

forming an inter-layer dielectric (ILD) layer of a second dielectric material different from the first dielectric material;

patterning the ILD layer to form openings that expose the first metal features; and forming second metal features in the openings of the ILD layer, wherein the second metal features are constrained to be self-aligned with the first metal features by the extruded portions of the dielectric layer and are landing on the first metal features.

14. The method of claim 13, wherein the ILD layer includes a low-k dielectric material and the dielectric material includes at least one of silicon oxide, silicon nitride, silicon oxynitride, metal oxide, metal nitride, metal oxy nitride and a combination thereof.

15. The method of claim 13, wherein the recessing evenly both the dielectric layer and the hard mask includes recessing both the dielectric layer and the hard mask such that a bottom portion of the hard mask remains and a thickness of the remained hard mask is greater than 10 Angstrom.

16. The method of claim 13, wherein the hard mask includes one of titanium nitride and tungsten-doped carbon (WdC).

17. The method of claim 13, wherein the patterning the ILD layer includes performing an etching process using an etchant containing fluorocarbon radicals and oxygen to selectively etch the second dielectric material and substantially not etch the first dielectric material.

18. A method of forming an integrated circuit structure, comprising:

depositing a first metal layer on a semiconductor substrate;

depositing a hard mask layer on the first metal layer;

forming a first mandrel material layer on the hard mask layer;

forming a spacer layer on sidewalls of the first mandrel material layer;

forming a second mandrel material layer to fill in gaps defined by the spacer layer and the first mandrel material layer;

performing an etching process to selectively remove the spacer layer, thereby forming first openings defined by the first and second mandrel material layers;

transferring the first openings to the hard mask layer, thereby forming a patterned hard mask;

patterning the first metal layer to form first metal features using the patterned hard mask as an etch mask;

depositing a dielectric layer of a first dielectric material on the first metal features and in gaps among the first metal features;

recessing evenly both the dielectric layer and the patterned hard mask;

removing the patterned hard mask, thereby having portions of the dielectric layer extruded above the first metal features;

forming an inter-layer dielectric (ILD) layer of a second dielectric material different from the first dielectric material; and patterning the ILD layer by selective etching to form second openings that expose the first metal features, wherein the second openings are constrained to be self-aligned with the first metal features by the extruded portions of the dielectric layer.

19. The method of claim 18, further comprising forming second metal features in the second openings of the ILD layer, wherein the second metal features are landing on the first metal features.

20. The method of claim 18, wherein the recessing evenly both the dielectric layer and the patterned hard mask includes recessing both the dielectric layer and the patterned hard mask such that a bottom portion of the patterned hard mask remains on the first metal features.

* * * * *